United States Patent [19]
Hsu et al.

[11] Patent Number: 5,726,653
[45] Date of Patent: Mar. 10, 1998

[54] TRI-STEP ANALOG-TO-DIGITAL CONVERTER

[75] Inventors: Po-Chin Hsu, Taipei; Yung-Yu Lin, Tainan, both of Taiwan

[73] Assignee: Industrial Technology Research Institute, Hsinchu, Taiwan

[21] Appl. No.: 589,277

[22] Filed: Jan. 22, 1996

[51] Int. Cl.$^6$ .................................................. H03M 1/12
[52] U.S. Cl. .......................... 341/156; 341/158; 341/159; 341/160
[58] Field of Search .................................. 341/156, 158, 341/159, 160

[56] References Cited

U.S. PATENT DOCUMENTS

| | | | |
|---|---|---|---|
| 4,612,531 | 9/1986 | Dingwall et al. | 340/347 AD |
| 4,635,036 | 1/1987 | Yoshizawa | 340/347 AD |
| 4,745,393 | 5/1988 | Tsukada et al. | 340/347 AD |
| 4,893,124 | 1/1990 | Tsuji et al. | 341/156 |
| 5,099,240 | 3/1992 | Nakatani et al. | 341/156 |
| 5,247,301 | 9/1993 | Yahagi et al. | 341/156 |
| 5,349,354 | 9/1994 | Ito et al. | 341/156 |

*Primary Examiner*—Jeffrey A. Gaffin
*Assistant Examiner*—Jason L. W. Kost
*Attorney, Agent, or Firm*—George O. Saile; Stephen B. Ackerman

[57] ABSTRACT

An analog to digital converter for the conversion of an analog input signal to a digital output code is disclosed. The analog to digital converter has a voltage reference generator to create a plurality of voltage references that divides the total conversion range of the input into increments equal to the smallest resolution increment. The digital output code is divided into most significant bits, intermediate significant bits and least significant bits. The most significant bits are encoded from a set of coarse digital signals that are formed in a set of coarse comparators. The coarse digital code is used to determine the selection of the sub-coarse voltage references. The intermediate significant bits are encoded from a set of subcoarse digital signals. The subcoarse digital code that and the coarse digital code are used to determine the selection of the fine voltage references. The least significant bits and a correction factor for the intermediate significant bits are encoded from a set of fine digital signals. The digital codes that form the most significant bits, the intermediate bits, the fine bits, and the correction factor are encoded in an output encoder to form the digital output word.

28 Claims, 7 Drawing Sheets

TRI-STEP ANALOG-TO-DIGITAL CONVERTER

BACKGROUND OF INVENTION

1. Field of the Invention

The present invention relates generally to Analog to Digital (A/D) converters and converting methods, and more particularly to multi-stage parallel type converters which use the first stage of conversion to determine the coarse range of the input voltage and a subsequent stages to resolve the analog input signal to finer increments. The present invention has applicability to video and digital signal processing.

2. Description of the Background Art

Figure 1:
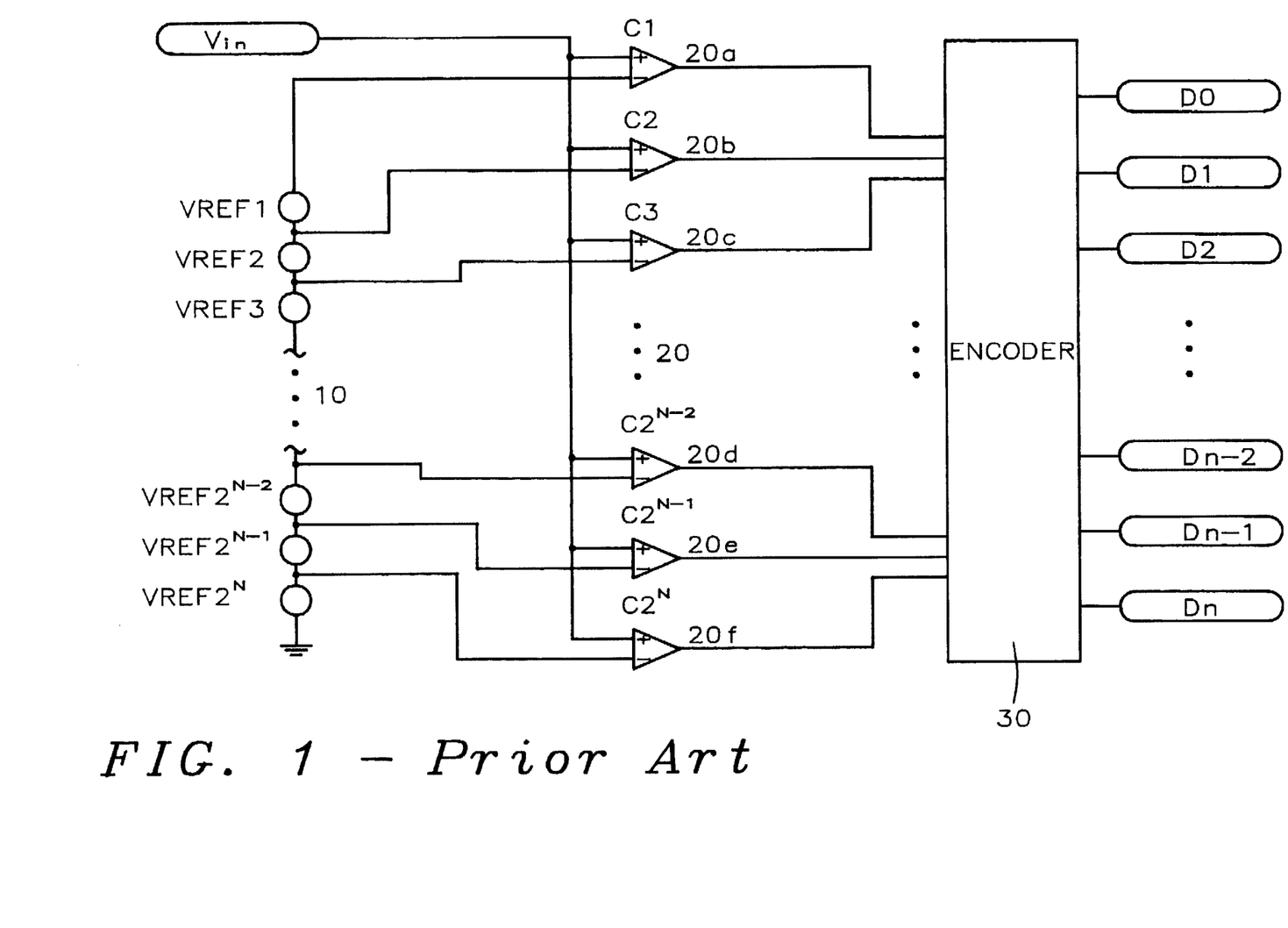
FIG. 1 is a schematic drawing illustrating the prior art of parallel or Flash A/D converter.

The application of digital processing and transmission methods to analog information requires a technique for the conversion of signals from their analog form to a digital representation. Well known types of A/D converters include the Successive Approximation type which produces a digital output using a digital to analog converter to create successive trial and error approximations of the input, and the parallel comparator type or FLASH converter, which compares multiple voltage references to the input voltage and outputs from the encoding logic the digital code representing the voltage reference closest to the input voltage in one operation. FIG. 1 shows a representation of the FLASH type of A/D Converter. Typically the output is a binary code that is constructed in the Encoder Logic 30 thus providing an n bit resolution of the input signal. This structure typically requires $2^n$ voltage references 10 and $2^n$ comparators 20. As the resolution of this type of converter is improved (the number of output bits increases), the design becomes unwieldy.

In order to simplify the design of the FLASH A/D Converter, two techniques are known. In both techniques multiple stages of conversion are used accomplish the A/D conversion. In the first technique, as shown in U.S. Pat. No. 5,302,869 (Hosotani et al.), U.S. Pat. No. 5,389,929 (Nayebi et al), U.S. Pat. No. 5,353,027 (Vorenkamp et al.), U.S. Pat. No. 5,369,309 (Bacrania et al.), and U.S. Pat. No. 5,387,914 (Mangelsdorf), the first stage is a coarse resolution FLASH A/D conversion and the second stage, with a Digital to Analog Converter, adjusts the voltage references of the voltage comparators to form a fine resolution conversion. The results of the two conversions are encoded to form the digital output word representing the magnitude of the analog input voltage. In the second technique, as shown in U.S. Pat. No. 5,291,198 (Dingwall et al.), U.S. Pat. No. 5,223,836 (Komatsu), U.S. Pat. No. 5,400,029 (Kobayashi), U.S. Pat. No. 4,733,217 (Dingwall), U.S. Pat. No. 5,349,354 (Ho, et al.) there will be multiple conversion stages with voltage references being appropriately switched to each stage by decision logic based on the results of the previous comparison stages.

Figure 2:
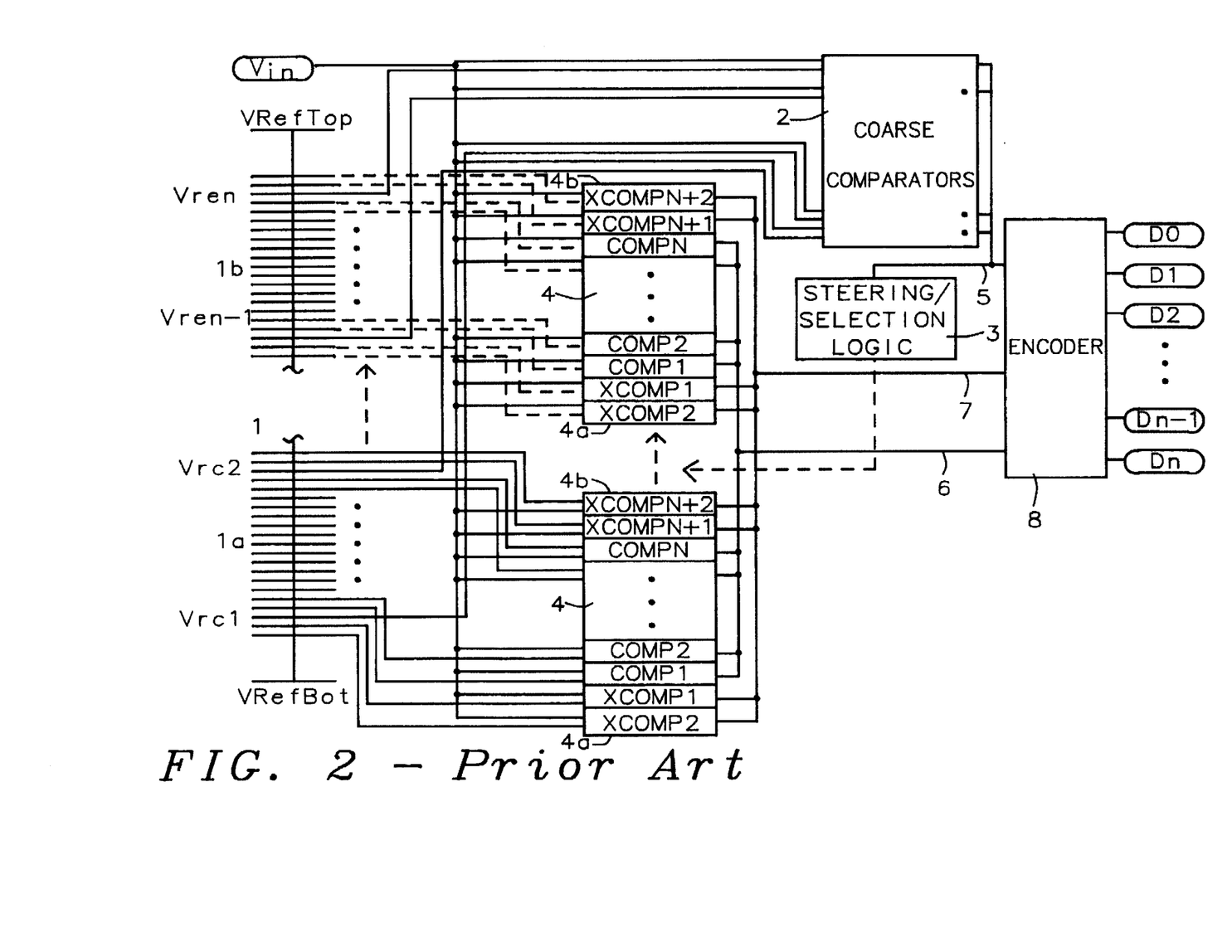
FIG. 2 is a schematic diagram of prior art illustrating a two stage A/D converter.

As an example of the second techniques of multiple stage conversion, see in FIG. 2., which is a schematic diagram of U.S. Pat. No. 4,903,028 (Fukashima), that by creating a set of voltage sources 1 that have incrementally increasing values from $V_{REFBOT}$ (the lowest value) to $V_{REFTOP}$ (the highest value) establishes the range of conversion of the voltage input ($V_{in}$). A set of Coarse Subrange Comparators 2 are connected to the voltage input and to the set of voltage references at discrete intervals establishing the coarse subranges 1a, 1b of $V_{in}$. The output of the Coarse Subrange Comparators 5 is the input to a Steering Logic and Switch Unit 3 that places a set of Fine Subrange Comparators 4 at the appropriate Subrange of the Voltage Reference Set 1.

The set of Voltage References 1a are divided into fine increments establishing the maximum resolution of the conversion of $V_{in}$ to Digital Output {D0, D1, D2, ..., Dn}. As $V_{in}$ changes the value of the output codes or the Coarse Subrange Comparators 5 change and the Steering Logic and Switch Unit 3 moves the Fine Subrange Comparators 4 to the next subrange (from 1a to 1b).

Due to the tolerances in component selection and process variation, the Output Codes 5 of the Coarse Subrange Comparators 2 may be in error. To detect this error, there will be Extra Fine Subrange Comparators 4a & 4b that will be placed above and below the subrange 1a or 1b determined by $V_{in}$. The output of the Extra Fine Comparators 4a & 4b form an error code 7. The output codes for Fine Subrange Comparators 6, the set of error codes 7, and the set of Coarse Subrange Codes 5 are interpreted by the Output Encoding Logic 8 to determine the output digital representation {D0, D1, D2, ..., Dn}. of the voltage input $V_{in}$.

Figure 3:
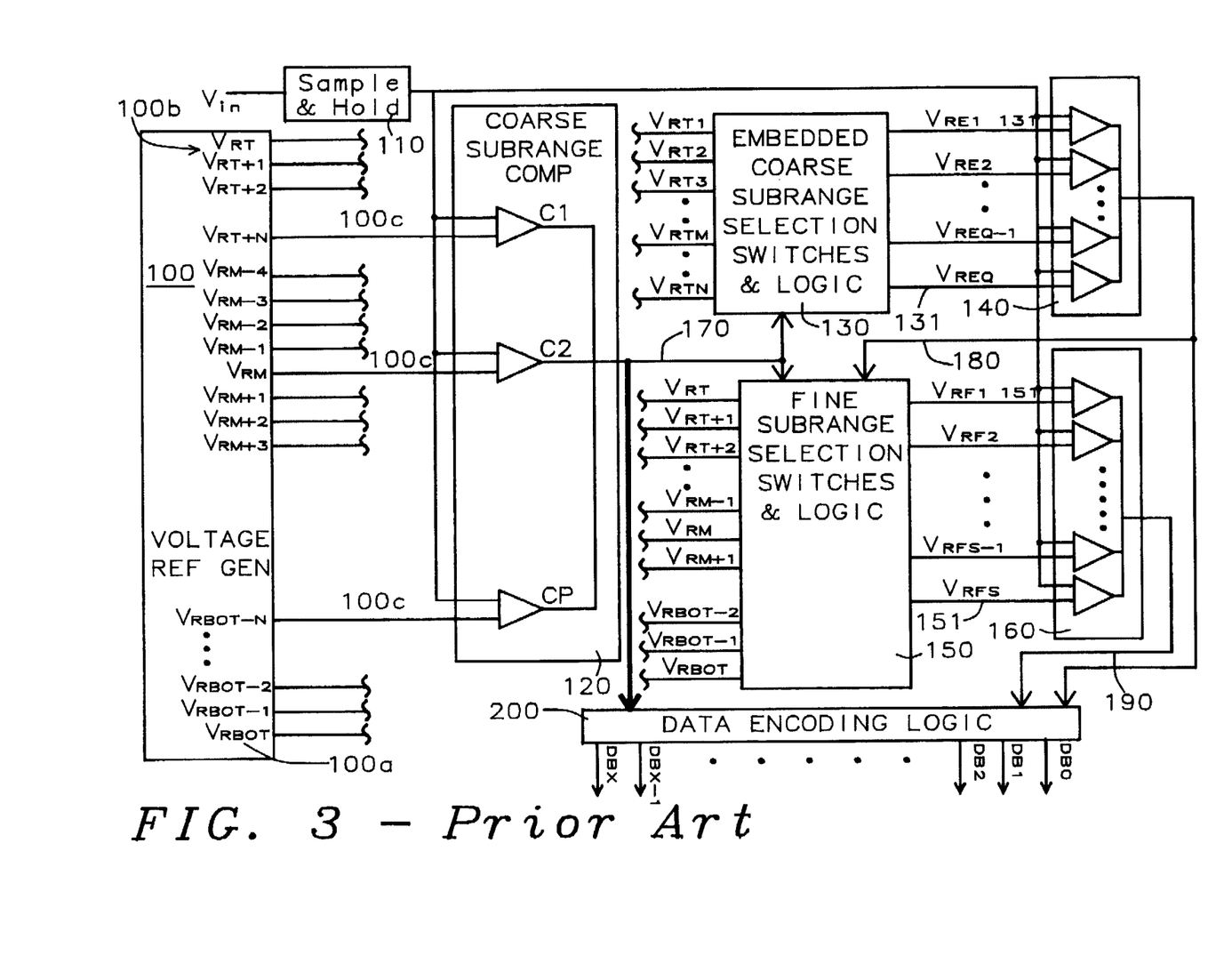
FIG. 3 is a schematic diagram of prior art illustrating an embedded subranging A/D converter.

In the foregoing there are two sets of error detection circuits. The error correction function is stimulated on only one side of the Coarse Subrange on each comparison cycle of the Fine Subrange comparators. This type of configuration consumes additional power and adds additional complexity to the physical implementation. To reduce the number of extra comparators and simplify the complexity of the physical structure, U.S. Pat. No. 5,581,255 (Hsu), assigned to the same assignee as the present invention, as shown in FIG. 3, uses a set of Embedded Coarse Subrange Comparators 140. The reference codes generated by the Embedded Coarse Comparators determine the proper reference range for the Fine Subrange Comparators 160. The codes from the Coarse Subrange Comparators 170, the Embedded Coarse Subrange Comparators 180, and the Fine Subrange Comparators 190 are encoded to form the output digital code. The selection to the placement of the Embedded Coarse Subrange Comparators 140 input references 131 are determined by the Embedded Coarse Subrange Selection Logic and Switches 130 from the input codes of the Coarse Subrange Comparators 170. The placement of the Fine Subrange Comparators References 151 are determined by the Fine Subrange Selection Logic and Switches 150 with input from the Coarse Subrange Comparators 170 and the Embedded Coarse Comparators 180.

SUMMARY OF THE INVENTION

An object of this invention is the reduction of complexity in the physical implementation of parallel analog-to-digital converters. Another object of this invention is the reduction in power consumption by the elimination of unneeded circuitry. Furthermore, an object is the enhancement of the concept of the embedded subranging analog-to-digital converter.

To accomplish the above objects the Tri-Step A/D converter has a coarse resolution A/D converter, a sub-coarse A/D converter, and a fine A/D converter. A sample and hold circuit samples an incoming analog input voltage at discrete periods of time and retains the sample of the analog input voltage as an input signal source for the coarse A/D converter, sub-coarse A/D converter, and fine A/D converter. A voltage reference generator is coupled between two reference voltage sources to create a plurality of voltage references.

The coarse A/D converter is connected to the sampled analog input signal which is compared to a coarse set of voltage references from the voltage reference generator to create a coarse digital code. The coarse digital code is passed to a reference voltage selection logic means which is connected to a voltage reference selection switch to select a set of the plurality of reference voltages which are the sub-coarse reference voltages.

The sub-coarse A/D converter is connected to the sampled input signal which is compared the sub-coarse reference voltages to form a sub-coarse digital code. The sub-coarse digital code and the coarse digital code are now used by the reference voltage selection logic means to select a set of switches in the voltages reference selection switch to create a set of fine voltage references from the plurality of voltage references.

The fine A/D converter is connected to the sampled input signal which is compared with the fine voltage references to form a fine digital code.

The coarse digital code, the sub-coarse digital code, and the fine digital code are translated in the output encoding means to form the output digital code. The output digital code is a binary number representing the magnitude of the analog input voltage.

DETAILED DESCRIPTION OF THE INVENTION

Figure 4:
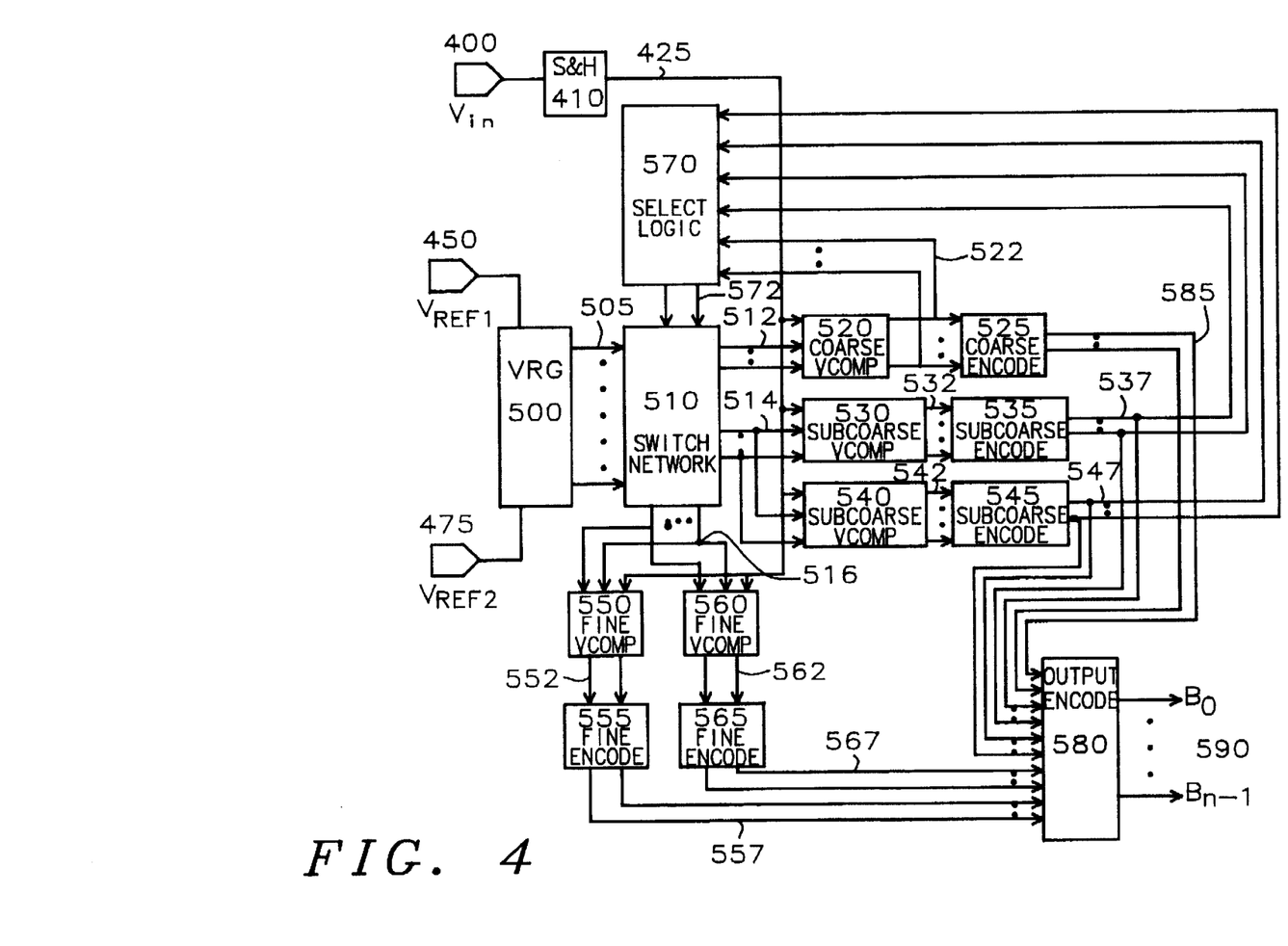
FIG. 4 is a functional block diagram of the preferred embodiment of this invention.

Referring to FIG. 4, the analog input voltage ($V_{in}$) 400 is connected to a sample and hold circuit 410 to periodically sample the ($V_{in}$) 400 and retain it as the sampled analog input voltage 425.

The voltage reference generator 500 is connected between voltage reference sources $V_{ref1}$ 450 and $V_{ref2}$ 475. The voltage reference generator 500 creates a plurality of reference voltages 505 that are incrementally increasing from $V_{ref2}$ 475 to $V_{ref1}$ 450. The increment of the reference voltages 505 will be determined as:

$$\frac{V_{ref1} - V_{ref2}}{2^n}$$

where n is the number of bits in the digital output code 590. The plurality of reference voltages 505 is connected to the voltage reference switching network 510. The coarse set of voltage references 512 are extracted from the plurality of reference voltages 505 and permanently connect to the coarse set of voltages comparators 520. The sampled analog input voltage 425 is compared to the coarse set of voltage references 512. The results of the comparison is a coarse thermometer code 522 (a thermometer coded is a binary code that is formed by each successive digit of the code changing to a "1" as the code increases, for example:

| | |
|---|---|
| 0000 | The lowest value of the code |
| 0001 | |
| 0011 | |
| 0111 | |
| 1111 | The highest value of the code). |

The coarse thermometer code 522 is connected to the coarse encoder 525. The coarse encoder 525 converts the coarse thermometer codes 522 to the coarse digital code 585.

The coarse thermometer code 522 is connected to the voltage reference selection logic means 570 and processed to set the appropriate switch selection lines 572. The switch selection lines 572 are connected to the voltage reference switching network 510 to activate the appropriate switches to connect a set of the plurality of references 505 to create the sub-coarse voltage references 514.

The sub-coarse voltage references are connected to the sub-coarse comparators 530 and 540. The sampled analog input voltage 425 is compared in the sub-coarse comparators 530 and 540 to the sub-coarse voltage references 514 to form the sub-coarse thermometer codes 532 and 542. The sub-coarse thermometer codes 532 and 542 are connected to the sub-coarse encoders 535 and 545 respectively. The sub-coarse encoders create the sub-coarse digital codes 537 and 547.

The sub-coarse digital codes 537 and 547 are connected to the voltage reference selection logic means 570. The voltage reference selection logic means 570 processes the coarse 522 and the sub-coarse 537 and 547 digital codes to set the appropriate switch selection lines 572. The switch selection lines 572 are connected to the voltage switching network to activate the appropriate switches to connect a set of the plurality of reference voltages 505 to create the fine voltage references 516.

The fine voltage references 516 are connected to the fine voltage comparators 550 and 560. The sampled analog input voltage 425 is compared to the fine reference voltages 516 to form the fine thermometer codes 552 and 562. The fine thermometer codes 552 and 562 are connected to the fine encoders 555 and 565. The fine encoders 555 and 565 convert the fine thermometer codes 552 and 562 to the fine digital codes 557 and 567.

The coarse digital codes 585, the sub-coarse digital codes 537 and 547, and the fine digital codes 557 and 567 are transferred to the output encoder 580, where they are converted to the output digital code 590. The output digital code 590 is a binary number representing the magnitude of the analog input voltage ($V_{in}$) 400. The digital code 585 is resolved into the set of most significant bits of the binary number. The sub-coarse digital codes 537 and 547 are resolved into a set of the intermediate significant bits of the binary number. And the fine digital codes 557 and 567 are resolved into a set of least significant bits of the binary number. The fine digital codes 557 and 567 also provide an error correction factor to the intermediate significant bits.

The structure of the A/D converter of FIG. 4 has duplicate sub-coarse 530 and 540 and fine 550 and 560 sets of comparators, and duplicate sub-coarse 535 and 545 and fine 555 and 565 encoders. This is to allow an interleaving of the processing to permit a faster sampling of $V_{in}$ 400 by the sample and hold circuitry 410. The first sample will be processed by sub-coarse comparators 530, sub-coarse encoder 535, fine comparators 550, and fine encoder 555.

While the next sample is process by sub-coarse comparators 540, sub-coarse encoder 545, fine comparators 560, and fine encoder 565. This interleaving process is continued to produce a series of digital codes that represent the $V_{in}$ 400.

Figure 5:
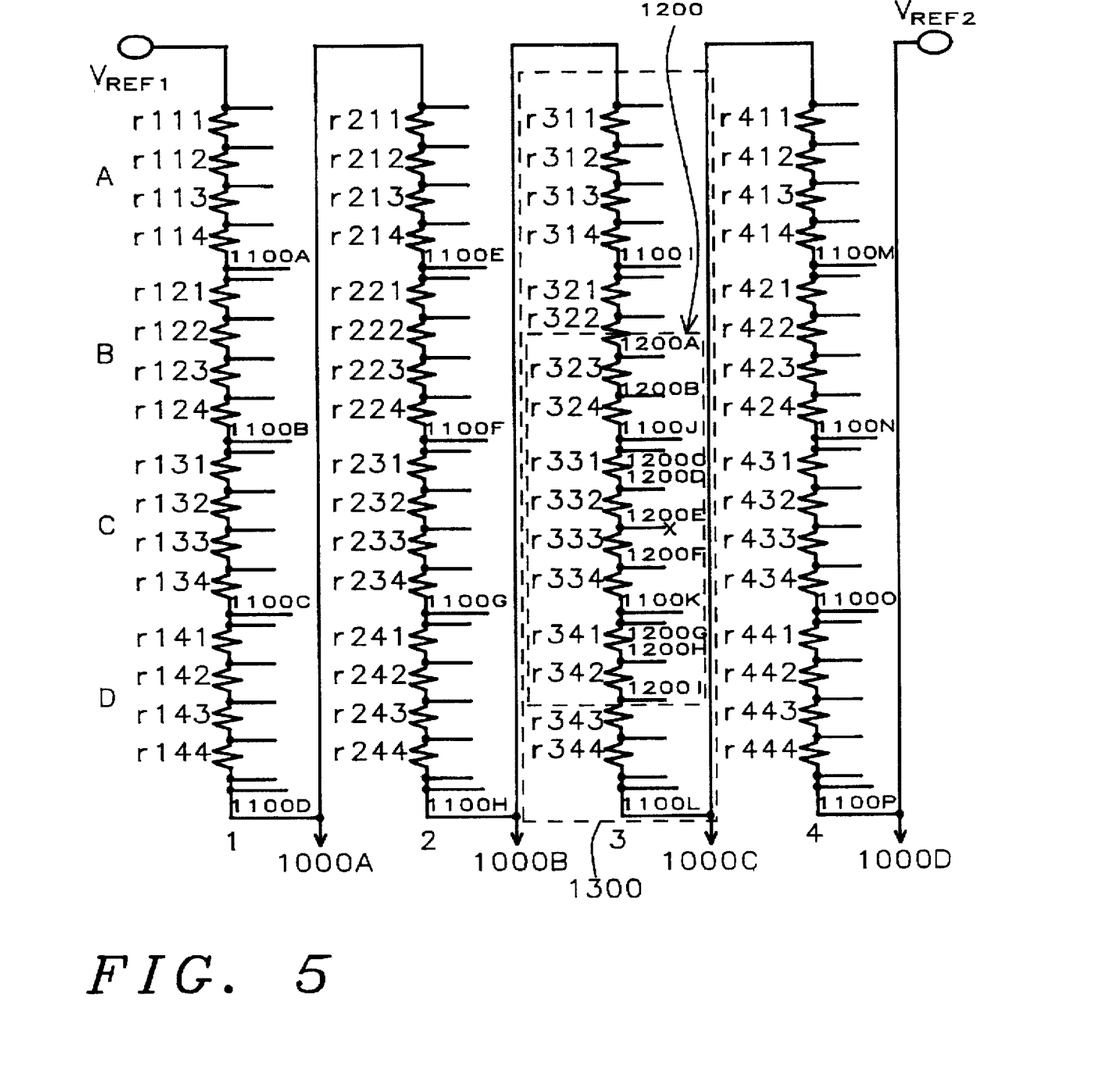
FIG. 5 is a schematic diagram of the voltage reference generator of this invention.

FIG. 5 illustrates the voltage reference generator (500 of FIG. 4). reference voltage supply $V_{ref1}$ is connected to resistor r111 and reference voltage supply $V_{ref2}$ is connected to resistor r444. The plurality of serially connected resistors r111, r112, . . . ,r443, and r444 for a voltage divider where at each connection of the plurality of serially connected resistors r111, r112, . . . ,r443, and r444 is one of the reference voltages (505 of FIG. 4).

The voltage references for the coarse comparators (520 of FIG. 4) are generated at points 1000A, 1000B, 1000C, and 1000D. These voltage references are permanently connected to the coarse comparators (520 of FIG. 4). The voltage references that are available for the sub-coarse comparators (530 and 540 of FIG. 4) are 1100A, 1100B, . . . ,1100O, and 1100P. These connections are determined in the switch selection logic means (570 of FIG. 4) and connected through the voltage reference switching network (510 of FIG. 4) to the sub-coarse comparators (530 and 540 of FIG. 4). All of the voltage references created by the serially connected resistors r111, r112, . . . ,r443, and r444 are available for connection to the fine comparators (550 and 560 of FIG. 4), but they are grouped such that a section such as 1200 are connected simultaneously through voltage reference switching network (510 of FIG. 4).

If the magnitude of the analog input voltage (400 of FIG. 4) were at position X with respect to the reference voltage generator, then outputs of the coarse comparators (520 of FIG. 4) would be 0011. This identifies that section 3 of the voltage reference generator constructed by the serially connected resistors r111, r112 . . . ,r443, and r444 as being the correct section to be connected as the sub-coarse voltage references (514 of FIG. 4). The voltage references connected through the voltage reference switching network (510 of FIG. 4) to the sub-coarse comparators (for instance 535 of FIG. 4) would be 1100I, 1100J, 1100K, and 1100L. The output of the sub-coarse comparator (535 of FIG. 4) would be 0011. This would now identify the section 1200 of the serially connected resistors r111, r112, . . . ,r443, and r444 as being the correct fine voltage references for the fine comparators (for instance 550 of FIG. 4). The output of the fine comparator (550 of FIG. 4) would be 0000111.

Figure 6:
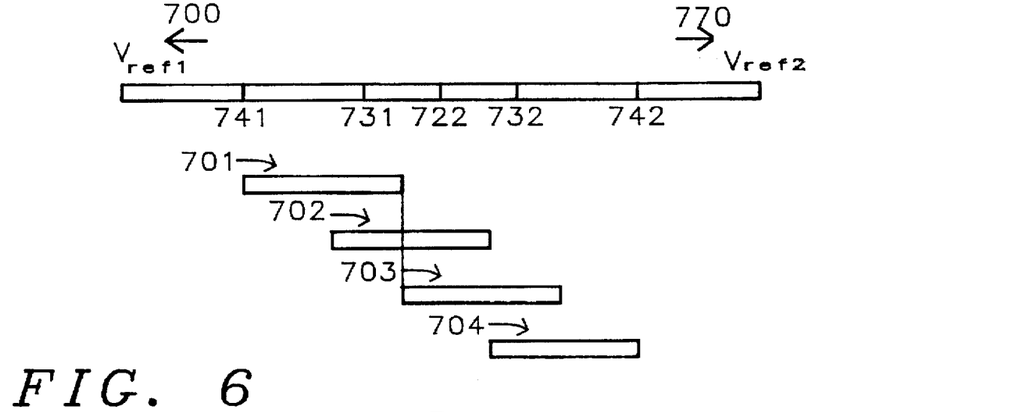
FIG. 6 is diagram illustrating the selection of the reference voltages of this invention.

FIG. 6 shows a segment of the voltage reference generator 700. The section of the voltage generator 700 from point 741 to 742 has been selected from the resolution of the coarse thermometer code (522 of FIG. 4). The sub-coarse reference points in this section 741-742 are 731, 721, and 732. The position of the voltage reference for the fine voltage comparators (550 and 560 of FIG. 4) depends upon where in the section the magnitude of the $V_{in}$ (400 of FIG. 4) is located. If the magnitude of $V_{in}$ (400 of FIG. 4) is less than voltage reference 731, then the fine voltage references (516 of FIG. 4) become the segment 701. If the magnitude of $V_{in}$ (400 of FIG. 4) is greater than voltage reference 731 and less than voltage reference 721, then the fine voltage references (516 of FIG. 4) become the segment 702. If the magnitude of $V_{in}$ (400 of FIG. 4) is greater than voltage reference 721 and less than voltage reference 732, then the fine voltage references (516 of FIG. 4) become the segment 703. And if the magnitude of $V_{in}$ (400 of FIG. 4) is greater than voltage reference 732, then the fine voltage references (516 of FIG. 4) become the segment 704.

Figure 7:
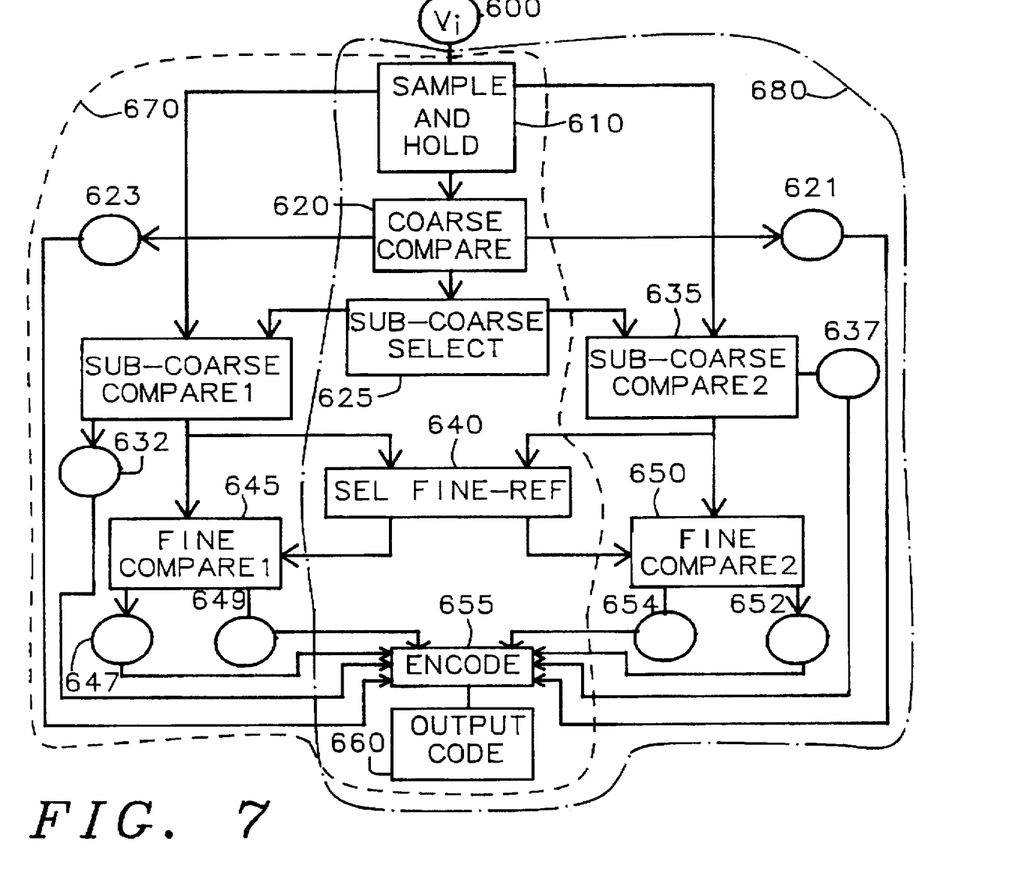
FIG. 7 is a flow chart of the method for the conversion of an analog signal to a digital code of this invention.

FIG. 7 is a flow chart for the method of conversion of an analog input signal ($V_i$) 600 to a digital output code 660. The first step 610 is the sampling of $V_i$ 600 and holding of the sampled $V_i$ 600. The second step 620 is the comparing of the sampled $V_i$ 600 with the coarse voltage references. After the coarse digital signals 621 and 623 have been derived, the sub-coarse voltage references are selected 625. The next step is the sub-coarse comparison 630 and 635, wherein the sampled $V_i$ 600 is compared with the selected sub-coarse voltage references. The sub-coarse digital signals 632 and 637 and the coarse digital signals 621 and 623 are then used to derive the selection of the fine reference voltages 640. The fine reference voltages are then compared 645 and 650 to the sampled $V_i$ 600 to form the fine digital signals 647 and 652 and the correction signals 649 and 654 for the sub-coarse digital signals. The coarse digital signals 621 and 623, the sub-coarse digital signals 632 and 637, the correction signals 649 and 654, and the fine digital signals 647 and 652 are then encoded 655 to form the output digital codes in series 660.

This method contains two paths. The first path 670 is implemented during a first sampling of the $V_i$ 600. The second path 680 is implemented during the second sampling of the $V_i$ 600. Each path 670 or 680 is selected on every alternate sampling of the $V_i$ 600. This allows an interleaving of the process thus allowing the sampling of $V_i$ 600 at a rate twice that of the single path.

Figure 8:
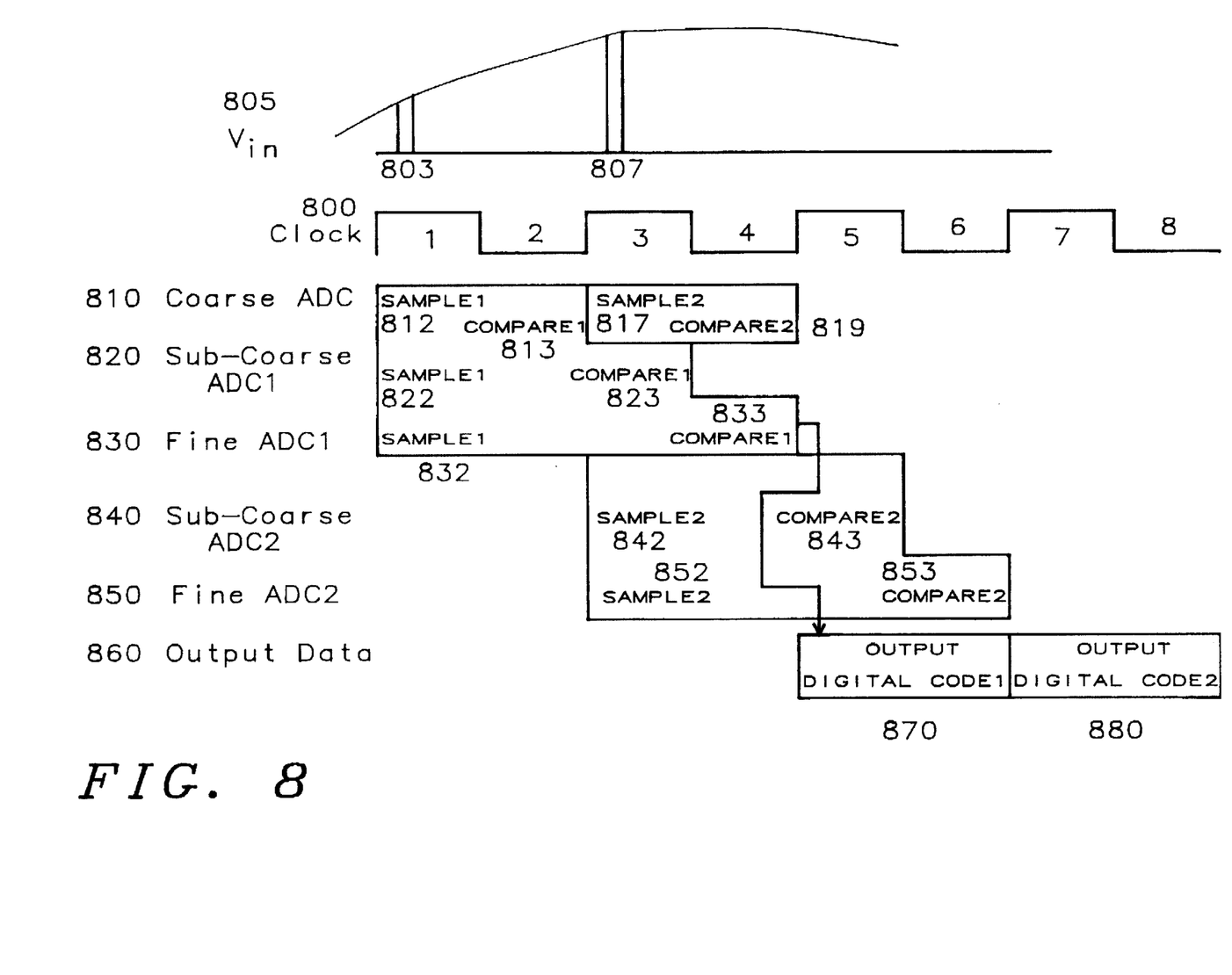
FIG. 8 is a timing diagram of a conversion cycle of this invention

The timing diagram for the A/D conversion of this invention is shown in FIG. 8. The analog input voltage $V_{in}$ 805 is sampled 803 during the clock 800 period 1. The sampled 812, 822, and 832 are held at the coarse A/D converter 810, the first sub-coarse A/D converter 820, and the first fine A/D converter 830. The first coarse comparison 813 is made during clock 800 period 2. The first sub-coarse comparison 823 is made during clock 800 period 3. At the same period, a second sampling 807 of $V_{in}$ 805 is taken. The sampled 817, 842, and 852 are held at the coarse A/D converter 810, the second sub-coarse A/D converter 840, and the fine A/D converter 850. The first fine comparison 833 and the second coarse comparison 817 is made during the clock 800 period 4. The second sub-coarse comparison 843 is made during clock 800 period 5. At the same time the first output digital codes 870 becomes valid and remains valid through clock 800 period 6. Also, during clock 800 period 6, the second fine comparison 853 is made. The second output digital codes 880 becomes valid during clock 800 period 7.

This timing demonstrates the interleaving process of the conversion. By duplication of the conversion, the sampling of the analog input voltage can be accomplished at a rate twice that of the single conversion.

While the invention has been particularly shown and described with reference to the preferred embodiments thereof, it will be understood by those skilled in the art that various changes in form and details may be made without departing from the spirit and scope of the invention.

What is claimed is:

1. A tri-step analog-to-digital converter for the conversion of an analog input voltage signal to an output digital code, comprising:
   a) a sample and hold means to sample at periodic intervals the analog input voltage signal and hold the sampled analog input signal during the conversion;
   b) a reference voltage generator coupled between a first reference voltage source and second reference voltage source to create a plurality of reference voltages from said first and second voltage sources;
   c) a reference voltage selection switch network connected to the plurality of reference voltages;
   d) a coarse resolution analog-to-digital converter coupled to the sampled analog input signal to convert said sampled analog input signal to a coarse digital code;

e) a sub-coarse resolution analog-to-digital converter coupled to the sampled analog input signal to convert said sampled analog input signal to a sub-coarse digital code;

f) a fine resolution analog-to-digital converter coupled to the sampled analog input signal to convert said sampled analog input signal to a fine digital code;

g) a reference voltage selection logic means coupled to the reference voltage selection switch network to select a coupling of the plurality of reference voltages to the sub-coarse and fine analog-to-digital converter's; and h) an output encoding means to translate the coarse digital code, the sub-coarse digital code, and the fine digital code to an output digital code.

2. The converter of claim 1 wherein the reference voltage generator comprises a first resistor connected to the first reference voltage source, a last resistor connected to the second reference voltage source, and plurality of serially connected resistors coupled between the first and last resistors.

3. The converter of claim 2 wherein the voltage developed at each connection of the plurality of serial connected resistors is one of the plurality reference voltages, the voltage difference of the voltages developed at two adjacent connections of the plurality of serial connected resistors equals to:

$$(V_{REF1} - V_{REF2})/2^n$$

Where $V_{REF1}$ is magnitude of the first reference voltage source, $V_{REF2}$ is the magnitude of the second reference voltage source, and n is the number of bits in the output digital code.

4. The converter of claim I wherein the coarse resolution analog-to-digital converter comprises:

a) a first plurality of voltage comparators, wherein each comparator comprises a voltage input terminal coupled to the analog input voltage signal, a voltage reference terminal coupled to one of the plurality of reference voltages, a compare output terminal where a comparator output signal is placed, and a voltage comparing means that will generate the comparator output signal that has a first state if the analog input voltage signal present at the input terminal is larger than the reference voltage present at the reference voltage terminal, and a second state if the analog input voltage present at the input terminal is less than the reference voltage present at the reference voltage terminal; and b) a coarse digital encoder for translating the comparator output signals from the first plurality of voltage comparators to said coarse digital code that represents a coarse approximation of the magnitude of the analog input signal.

5. The converter of claim 4 wherein the coarse digital code forms the most significant bits of the output digital word.

6. The converter of claim 1 wherein the reference voltage selection switch comprises:

a) a plurality of sub-coarse resolution selection switches to selectively couple a first subset of the plurality of voltage references to the sub-coarse resolution analog-to-digital converter; and b) a plurality of fine resolution selection switches to selectively couple a second subset of the plurality of voltage references to the fine resolution analog-to-digital converter.

7. The converter of claim 6 wherein the reference voltage selection logic means comprises:

a) a coarse digital code input terminal connected to the coarse analog-to-digital converter;

b) a sub-coarse digital code input terminal connected to the subcoarse analog-to digital converter;

c) a sub-coarse switch location resolution means to determine the activation of the plurality of sub-coarse resolution selection switches based on the coarse digital code; and d) a fine switch location resolution means to determine the activation of fine resolution selection switches based on the coarse digital code and the sub-coarse digital code.

8. The converter of claim 1 wherein the sub-coarse resolution analog-to-digital converter comprises:

a) a second plurality of voltage comparators, wherein each comparator comprises a voltage input terminal coupled to the analog input voltage signal, a voltage reference terminal coupled to one of the sub-coarse reference voltages, a compare output terminal where a comparator output signal is placed, and a voltage comparing means that will generate the comparator output signal that has a first state if the analog input voltage signal present at the input terminal is larger than the sub-coarse reference voltage present at the reference voltage terminal; and a second state if the analog input voltage present at the input terminal is less than the sub-coarse reference voltage present at the reference voltage terminal, and b) a sub-coarse resolution digital encoder for translating the comparator output signals from the second plurality of voltage comparators to said sub-coarse digital code that represents an intermediate refinement of the coarse approximation of the magnitude of the analog input signal.

9. The converter of claim 8 wherein the sub-coarse digital code form the intermediate significant bits of the digital output code.

10. The converter of claim 1 wherein the fine resolution analog-to-digital converter comprises:

a) a third plurality of voltage comparators, wherein each comparator comprises a voltage input terminal coupled to the analog input voltage signal, a voltage reference terminal coupled to the fine voltage references, a compare output terminal where a comparator output signal is placed, and a voltage comparing means that will generate the comparator output signal that has a first state if the analog input voltage signal present at the input terminal is larger than the fine reference voltage present at the reference voltage terminal, and a second state if the analog input voltage present at the input terminal is less than the fine reference voltage present at the reference voltage terminal; and b) a fine resolution digital encoder for translating the comparator output signals of the third plurality of comparators to said fine digital code that represents a fine determination of the coarse approximation of the analog input signal.

11. The converter of claim 10 wherein the fine digital code forms the least significant bits and a correction factor to the intermediate significant bits.

12. The converter of claim 1 wherein the output digital code is a binary number comprising a set of most significant bits, a set of intermediate significant bits, and a set of least significant bits.

13. A three stage analog-to-digital converter for the conversion of an analog input signal to a digital output code, comprising a) a sample and hold means to sample at periodic alternate first sampling and second sampling intervals of time the analog input voltage signal and hold the sampled analog input signal during the conversion;

b) a reference voltage generator coupled between a first reference voltage source and second reference voltage source to create a plurality of reference voltages from said first and second voltage sources;

c) a reference voltage selection switch network connected to the plurality of reference voltages;

d) a coarse voltage comparing means coupled to the sampled analog input signal to convert said analog input signal to a set of coarse thermometer codes;

e) a coarse encoder to convert the set of coarse thermometer codes to a set of coarse digital codes representing a coarse approximation of the magnitude of the sampled analog input signal;

f) a first sub-coarse voltage comparing means coupled to the analog input signal to convert said analog input signal to a set of first sub-coarse thermometer codes;

g) a second sub-coarse voltage comparing means coupled to the analog input signal to convert said analog input signal to a set of second sub-coarse thermometer codes;

h) a first sub-coarse encoder to convert the set of first sub-coarse thermometer codes to a first set of sub-coarse digital codes;

i) a second sub-coarse encoder to convert the set of first sub-coarse thermometer codes to a second set of sub-coarse digital codes;

j) a first fine voltage comparing means coupled to the analog input signal to convert said analog input signal to a set of first fine thermometer codes;

k) a second fine voltage comparing means coupled to the analog input signal to convert said analog input signal to a set of second fine thermometer codes;

l) a first fine encoder to convert the set of first fine thermometer codes to a first set of fine digital codes;

m) a second fine encoder to convert the set of second fine thermometer codes to a second set of fine digital codes;

n) a reference voltage selection logic means coupled to the reference voltage selection switch network to select a coupling of the plurality of reference voltages to the sub-coarse and fine analog-to-digital converters; and o) an output encoding means to translate the coarse digital code, the sub-coarse digital code, and the fine digital code to an output digital code comprising n bits.

14. The converter of claim 13 wherein the reference voltage generator comprises a first resistor connected to the first reference voltage source, a last resistor connected to the second reference voltage source, and plurality of serially connected resistors coupled between the first and last resistors.

15. The converter of claim 14 wherein the voltage developed at each connection of the plurality of serial connected resistors is one of the plurality reference voltages, and the voltage difference of the voltages developed at two adjacent connections of the plurality of serial connected resistors equals to $$(V_{REF1} - V_{REF2})/2^n$$

Where $V_{REF1}$ is magnitude of the first reference voltage source, $V_{REF2}$ is the magnitude of the second reference voltage source, and n is the n bits in the output digital code.

16. The converter of claim 13 wherein the reference voltage selection switch comprises:

a) a plurality of sub-coarse resolution selection switches to selectively couple a first subset of the plurality of voltage references to the sub-coarse resolution analog-to-digital converter; and b) a plurality of fine resolution selection switches to selectively couple a second subset of the plurality of voltage references to the fine resolution analog-to-digital converter.

17. The converter of claim 16 wherein the reference voltage selection logic means comprises:

a) a coarse digital code input terminal connected to the coarse comparator mean;

b) a first sub-coarse digital code input terminal connected to the first sub-coarse encoder;

c) a second sub-coarse digital code input terminal connected to the second sub-coarse encoder;

d) a sub-coarse switch location resolution means to determine the activation of the plurality of sub-coarse resolution selection switches based on the coarse digital code; and e) a fine switch location resolution means to determine the activation of fine resolution selection switches based on the coarse digital code and the sub-coarse digital code.

18. The converter of claim 13 wherein the output digital code is a binary number comprising a set of most significant bits, a set of intermediate significant bits, and a set of least significant bits.

19. The converter of claim 13 wherein the coarse digital code forms the most significant bits of the output digital word.

20. The converter of claim 13 wherein the first sub-coarse comparator means comprises a) a voltage input terminal coupled to the analog input voltage signal;

b) a voltage reference terminal coupled to one of the plurality of reference voltages;

c) a compare output terminal where a comparator output signal is placed; and d) a voltage comparing means that will generate the comparator output signal that has a first state if the analog input voltage signal present at the input terminal is larger than the reference voltage present at the reference voltage terminal, and a second state if the analog input voltage present at the input terminal is less than the reference voltage present at the reference voltage terminal.

21. The converter of claim 13 wherein the second sub-coarse comparator means comprises a) a voltage input terminal coupled to the analog input voltage signal;

b) a voltage reference terminal coupled to one of the plurality of reference voltages;

c) a compare output terminal where a comparator output signal is placed; and d) a voltage comparing means that will generate the comparator output signal that has a first state if the analog input voltage signal present at the input terminal is larger than the reference voltage present at the reference voltage terminal, and a second state if the analog input voltage present at the input terminal is less than the reference voltage present at the reference voltage terminal.

22. The converter of claim 13 wherein the first fine comparator means comprises a) a voltage input terminal coupled to the analog input voltage signal;

b) a voltage reference terminal coupled to the fine voltage references;

c) a compare output terminal where a comparator output signal is placed; and d) a voltage comparing means that will generate the comparator output signal that has a first state if the analog input voltage signal present at the input terminal is larger than the fine reference voltage present at the reference voltage terminal, and a second state if the analog input voltage present at the input terminal is less than the fine reference voltage present at the reference voltage terminal.

23. The converter of claim 13 wherein the second fine comparator means comprises:

a) a voltage input terminal coupled to the analog input voltage signal;

b) a voltage reference terminal coupled to the fine voltage references;

c) a compare output terminal where a comparator output signal is placed; and d) a voltage comparing means that will generate the comparator output signal that has a first state if the analog input voltage signal present at the input terminal is larger than the fine reference voltage present at the reference voltage terminal, and a second state if the analog input voltage present at the input terminal is less than the fine reference voltage present at the reference voltage terminal.

24. The converter of claim 13 wherein at said first sampling interval, the conversion of said analog input signal to the output digital code is performed by the coarse comparing means, coarse encoding means, the first sub-coarse comparing means, the first sub-coarse encoder, the first fine comparing means, the first fine encoder, and the output encoding means.

25. The converter of claim 13 wherein at said second sampling intervals, the conversion of said analog input to the output digital code is performed by the coarse comparing means, coarse encoding means, the second subcoarse comparing means, the second sub-coarse encoder, the second fine comparing means, the second fine encoder, and the output encoding means.

26. A method for the conversion of an analog voltage signal to output digital codes representing the magnitude of said analog voltage signal, comprising the steps of:

a) sampling at periodic alternate first and second sampling intervals of time of the analog voltage signal;

b) serially comparing each of the sampled analog voltage signals at said first and second sampling intervals to a coarse set of reference voltages to form a first and second digital codes;

c) selecting a set of sub-coarse reference voltages;

d) respectively comparing of the sampled analog voltage signals at said first and second sampling intervals to the set of sub-coarse digital codes;

e) selecting a set of fine reference voltages with reference to the sub-coarse digital codes and coarse digital codes;

f) respectively comparing of the sampled analog voltage signals at said first and second sampling intervals to the set of fine reference voltages to form a first and second fine digital codes; and g) serially encoding of the set of first coarse, the first sub-coarse, and first fine digital codes and the set of second coarse, the second sub-coarse, and the second fine digital codes to form a first and a second output digital code in series.

27. The method of claim 26 wherein the respectively comparing of the sampled analog signals at said first and second sampling intervals to the set of fine reference voltages further forms a first and second error correction codes for being utilized in the encoding of the first and the second output digital codes.

28. A method for the conversion of an analog voltage signal to an output digital code representing the magnitude of said analog voltage signal, comprising the steps of a) sampling at periodic intervals of time of the analog voltage signal;

b) comparing of the sampled analog voltage signal to a coarse set of reference voltages to form a coarse digital code;

c) selecting a set of sub-coarse reference voltages;

d) comparing of the sampled analog voltage signal to the set of sub-coarse reference voltages to form a sub-coarse digital code;

e) selecting of a set of fine reference voltages;

f) comparing of the sampled analog voltage signal to the set of fine reference voltages to form a fine digital code; and g) encoding of the coarse digital code, sub-coarse digital code, and fine digital code to form the output digital code.

* * * * *